(12) United States Patent
Kim et al.

(10) Patent No.: US 11,075,231 B2
(45) Date of Patent: Jul. 27, 2021

(54) DISPLAY APPARATUS HAVING A STEPPED PART

(71) Applicant: SAMSUNG DISPLAY CO., LTD., Yongin-si (KR)

(72) Inventors: Hyo Jin Kim, Seoul (KR); Won Kyu Lee, Seoul (KR); Seung Gyu Tae, Osan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/807,352

(22) Filed: Mar. 3, 2020

(65) Prior Publication Data

US 2020/0203395 A1 Jun. 25, 2020

Related U.S. Application Data

(60) Continuation-in-part of application No. 16/157,837, filed on Oct. 11, 2018, now Pat. No. 10,580,805.
(Continued)

(30) Foreign Application Priority Data

Apr. 30, 2015 (KR) .................. 10-2015-0062088

(51) Int. Cl.
*H01L 27/12* (2006.01)

(52) U.S. Cl.
CPC ...... *H01L 27/1255* (2013.01); *H01L 27/1225* (2013.01); *H01L 27/1244* (2013.01); *H01L 27/1248* (2013.01)

(58) Field of Classification Search
CPC ............. H01L 27/1244; H01L 27/1255; H01L 27/1248; H01L 27/1225
See application file for complete search history.

(56) References Cited

U.S. PATENT DOCUMENTS 7,663,710 B2 * 2/2010 Park .................. G02F 1/136204
349/54
7,897,270 B2 * 3/2011 Kim .................... H01L 51/5004
428/690

(Continued)

FOREIGN PATENT DOCUMENTS

KR         100143037      4/1998
KR        1020010061594   7/2001
(Continued)

*Primary Examiner* — Bilkis Jahan
*Assistant Examiner* — Victor V Barzykin
(74) *Attorney, Agent, or Firm* — F. Chau & Associates, LLC

(57) ABSTRACT

Provided is a display apparatus including a substrate and a semiconductor layer including first and second semiconductor layers. A first gate insulating layer is formed on the semiconductor layer. A first gate wiring overlapping the first semiconductor layer is formed on the first gate insulating layer. A second gate insulating layer is formed on the first gate wiring. A second gate wiring overlapping the second semiconductor layer is formed on the second gate insulating layer. A third gate insulating layer covers the second gate wiring. A driving voltage line intersecting the first and second gate wirings is formed on the third gate insulating layer. A data line intersecting the first and second gate wirings is formed on the third gate insulating layer. A short circuit protection area is formed between the first gate wiring, the second gate wiring, the driving voltage line and the data line.

8 Claims, 12 Drawing Sheets

Related U.S. Application Data which is a division of application No. 15/091,624, filed on Apr. 6, 2016, now Pat. No. 10,128,279.

(56) References Cited

U.S. PATENT DOCUMENTS

| | | | |
|---|---|---|---|
| 8,450,738 B2 | 5/2013 | Tsubata et al. | |
| 10,128,279 B2 | 11/2018 | Kim et al. | |
| 2005/0134783 A1* | 6/2005 | Park | G02F 1/136286 |
| | | | 349/141 |
| 2005/0224793 A1* | 10/2005 | Chang | H01L 27/1237 |
| | | | 257/59 |
| 2007/0087616 A1* | 4/2007 | Sakakura | H01L 23/528 |
| | | | 439/395 |
| 2009/0078972 A1* | 3/2009 | Hwang | H01L 27/14601 |
| | | | 257/290 |
| 2011/0108846 A1* | 5/2011 | Choi | H01L 27/1214 |
| | | | 257/72 |
| 2012/0139876 A1* | 6/2012 | Jeon | G06F 3/0412 |
| | | | 345/175 |
| 2013/0037818 A1* | 2/2013 | Lee | H01L 27/3258 |
| | | | 257/72 |
| 2013/0334508 A1 | 12/2013 | Moon | |
| 2015/0048320 A1* | 2/2015 | Lee | H01L 27/1255 |
| | | | 257/40 |
| 2016/0322402 A1 | 11/2016 | Kim et al. | |
| 2019/0051676 A1 | 2/2019 | Kim et al. | |

FOREIGN PATENT DOCUMENTS

| | | |
|---|---|---|
| KR | 1020050064356 | 6/2005 |
| KR | 1020070050257 | 5/2007 |
| WO | WO2009/078200 | 6/2009 |

\* cited by examiner

DISPLAY APPARATUS HAVING A STEPPED PART

CROSS-REFERENCE TO RELATED APPLICATION

This application is a continuation in part of U.S. application Ser. No. 16/157,837, filed on Oct. 11, 2018, which is a divisional application of U.S. patent application Ser. No. 15/091,624, filed on Apr. 6, 2016, now U.S. Pat. No. 10,128,279 issued on Nov. 13, 2018, which claims priority under 35 U.S.C. § 119 to Korean Patent Application No. 10-2015-0062088 filed in the Korean Intellectual Property Office on Apr. 30, 2015, the disclosures of which are incorporated by reference herein in their entirety.

TECHNICAL FIELD

Exemplary embodiments of the present invention relate to a display apparatus, and more particularly to a display apparatus having a stepped part.

DISCUSSION OF RELATED ART

Various display apparatuses such as an organic light emitting device and a liquid crystal display may control a display operation by a thin film transistor (TFT). A display apparatus including a transistor and a capacitor driving the display apparatus may be formed on a substrate. The display apparatus may be formed by connecting display panels such as an organic light emitting panel and a liquid crystal panel, which include a plurality of pixels displaying an image, to the substrate.

Some high resolution display apparatuses have a structure in which a size of each unit pixel formed in the display apparatus is reduced or one pixel includes a plurality of transistors to more finely display an image.

As a disposition density of pixels included in the display apparatus is increased, a distance between adjacent transistors may be relatively short and therefore an occurrence of a short circuit between wirings formed in these transistors may be increased, such that a defective rate of products may be increased.

SUMMARY

Exemplary embodiments of the present invention may provide a display apparatus capable of protecting a short circuit from occurring between adjacent wirings.

Exemplary embodiments of the present invention are not limited to the exemplary embodiments described herein.

An exemplary embodiment of the present invention provides a display apparatus including a substrate and a semiconductor layer formed on the substrate. The semiconductor layer includes a first semiconductor layer and a second semiconductor layer spaced apart from the first semiconductor layer. A first gate insulating layer is formed on the semiconductor layer. A first gate wiring is formed on the first gate insulating layer. The first gate wiring overlaps the first semiconductor layer. A second gate insulating layer is formed on the first gate wiring. A second gate wiring is formed on the second gate insulating layer. The second gate wiring overlaps the second semiconductor layer. A third gate insulating layer covers the second gate wiring. A driving voltage line is formed on the third gate insulating layer. The driving voltage line intersects the first gate wiring and the second gate wiring. A data line is formed on the third gate insulating layer. The data line intersects the first gate wiring and the second gate wiring. A short circuit protection area is formed between the first gate wiring and the second gate wiring. The short circuit protection area is formed between the driving voltage line and the data line. An interval between the first gate wiring and the second gate wiring in the short circuit protection area is larger than an interval between the first gate wiring and the second gate wiring outside of the short circuit protection area.

The interval between the first gate wiring and the second gate wiring in the short circuit protection area may be an average value of the interval between the first gate wiring and the second gate wiring in the short circuit protection area.

The interval between the first gate wiring and the second gate wiring in the short circuit protection area may be a maximum value of the interval between the first gate wiring and the second gate wiring in the short circuit protection area.

The display apparatus may include a lower electrode of a capacitor formed on the second gate insulating layer; and an upper electrode of the capacitor formed on the third gate insulating layer.

The display apparatus may include a buffer layer formed between the substrate and the semiconductor layer.

Another exemplary embodiment of the present invention provides a display apparatus, including a substrate and a semiconductor layer formed on the substrate. The semiconductor layer includes a first semiconductor layer and a second semiconductor layer spaced apart from the first semiconductor layer. A first gate insulating layer is formed on the semiconductor layer. A first gate wiring is formed on the first gate insulating layer. The first gate wiring overlaps the first semiconductor layer. A second gate insulating layer is formed on the first gate wiring. A second gate wiring formed on the second gate insulating layer. The second gate wiring overlaps the second semiconductor layer. A third gate insulating layer covers the second gate wiring. A driving voltage line is formed on the third gate insulating layer. The driving voltage line intersects the first gate wiring and the second gate wiring. A data line is formed on the third gate insulating layer. The data line intersects the first gate wiring and the second gate wiring. A short circuit protection area is formed between the first gate wiring and the second gate wiring. The short circuit protection area is formed between the driving voltage line and the data line. A stepped part protrudes from any one of the first gate wiring and the second gate wiring formed in the short circuit protection area.

The stepped part may protrude from the first gate wiring toward the second gate wiring to be disposed under the second gate wiring. The stepped part may form a step on the second gate wiring and the third gate insulating layer.

The stepped part may protrude from the second gate wiring toward the first gate wiring to be disposed on the first gate wiring. The stepped part may form a step on the second gate wiring and the third gate insulating layer.

The stepped part may include a same material as at least one of the first gate wiring and the second gate wiring.

The display apparatus may include a lower electrode of a capacitor formed on the second gate insulating layer; and an upper electrode of the capacitor formed on the third gate insulating layer.

The display apparatus may further include a buffer layer formed between the substrate and the semiconductor layer.

According to an exemplary embodiment of the present invention a display apparatus reducing or preventing a short circuit from occurring between adjacent wirings may be provided.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION OF EXEMPLARY EMBODIMENTS

Figure 1:
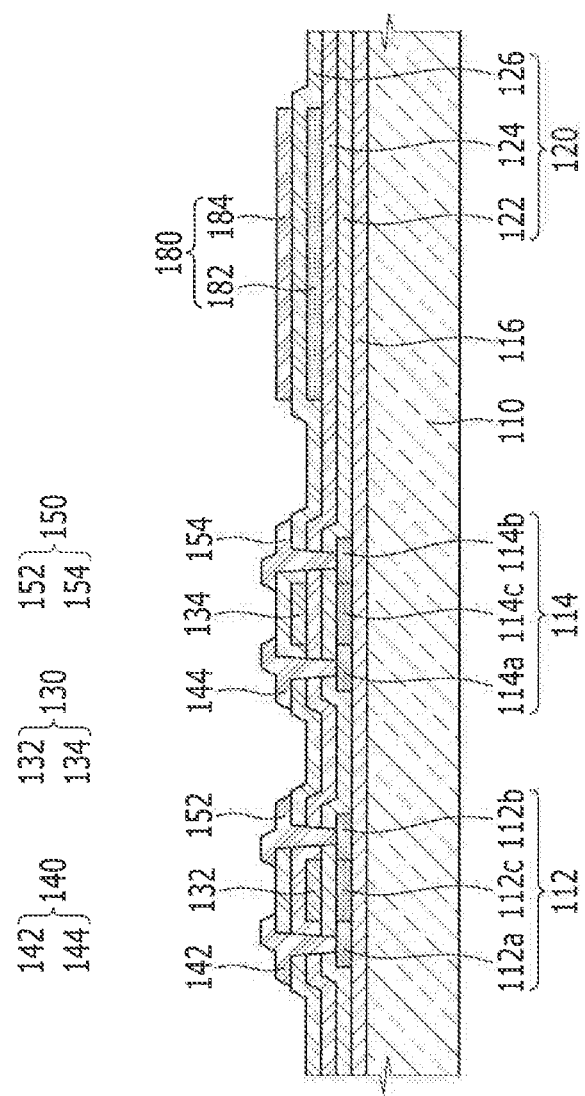
FIG. 1 is a diagram illustrating a cross section of a portion of a display apparatus according to an exemplary embodiment of the present invention.

Hereinafter, exemplary embodiments of the present invention will be described in more detail with reference to the accompanying drawings.

The drawings and description are to be regarded as illustrative in nature and not restrictive. Like reference numerals may refer to like elements throughout the specification and drawings. The size and thickness of components in the drawings are not limited to those shown in the drawings.

In the drawings, the thickness of layers, films, panels, or regions may be exaggerated for clarity. It will be understood that when an element such as a layer, film, region, or substrate is referred to as being "on" another element, it may be directly on the other element or intervening elements may be present.

Figure 2:
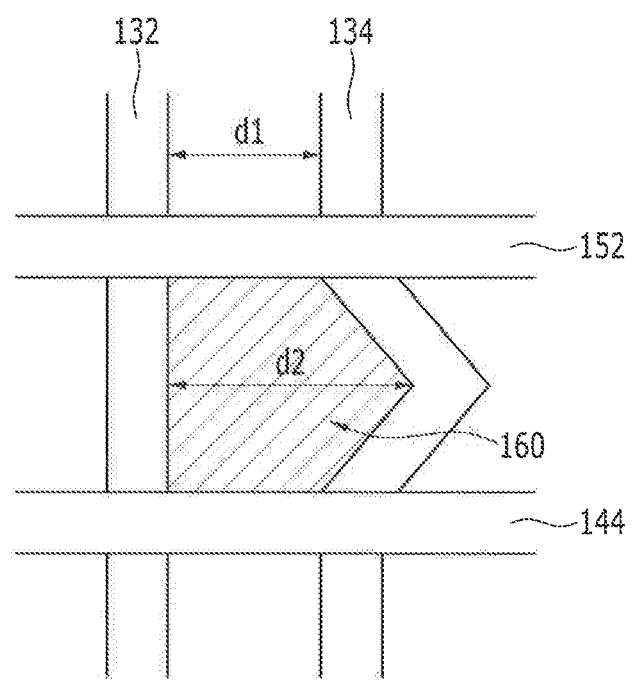
FIG. 2 is a diagram schematically illustrating a short circuit protection area according to an exemplary embodiment of the present invention.

FIG. 1 is a diagram illustrating a cross section of a portion of a display apparatus according to an exemplary embodiment of the present invention. FIG. 2 is a diagram schematically illustrating a short circuit protection area according to an exemplary embodiment of the present invention.

As illustrated its FIG. 1, a display apparatus according to an exemplary embodiment of the present invention may include a substrate 110, semiconductor layers 112 and 114, a gate insulating layer 120, a gate wire, driving voltage lines 140, 142, and 144, and data lines 150, 152, and 154. A portion of the gate insulating layer 120 may include a short circuit protection area 160 (see, e.g., FIG. 2).

The substrate 110 may be stacked with other components according to an exemplary embodiment of the present invention. The substrate may be a portion of a base of the display apparatus according to an exemplary embodiment of the present invention. The substrate 110 according to an exemplary embodiment of the present invention may include at least one relatively hard material such as glass, quartz, or ceramic, or at least one relatively soft material such as plastic. The substrate 110 may include at least one electrical insulating material.

The semiconductor layers 112 and 114 may be formed on the substrate 110. The semiconductor layers 112 and 114 may include a first semiconductor layer 112 and a second semiconductor layer 114.

Each of the semiconductor layers 112 and 114 may include polysilicon or an oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and a zinc oxide (ZnO), an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which may be composite oxides thereof. When the semiconductor layers 112 and 114 include the oxide semiconductor, the semiconductor layers 112 and 114 may include a separate passivation layer, which may protect the oxide semiconductor from external environments, such as high temperature.

Each of the semiconductor layers 112 and 114 may include channel areas 112a and 114a which may be channel-doped with N type impurities or P type impurities and may be doped on both sides of the channel areas 112a and 114a. Each of the semiconductor layers 112 and 114 may include source areas 112b and 114b and drain areas 112c and 114c which may be doped with doping impurities having an opposing type to the doping impurities doped in the channel areas 112a and 114a.

The channel areas 112a and 114a of the semiconductor layers 112 and 114 may overlap with the gate electrode in the thin film transistor for driving each pixel included in the display apparatus. The source areas 112b and 114b and the drain areas 112c and 114c each may be electrically connected to the source area and the drain electrode of the thin film transistor.

The first semiconductor layer 112 and the second semiconductor layer 114 may serve as a semiconductor layer, a switching semiconductor layer, and an emission control semiconductor layer depending on the role of the overlappingly disposed thin film transistor, but exemplary embodiments of the present invention are not limited thereto. As the number of thin film transistors disposed within each pixel included in the display apparatus is increased, the number of semiconductor layers 112 and 14 overlapping with each transistor may be increased and roles performed by each of the semiconductor layers 112 and 114 may be subdivided.

A buffer layer 116 may be formed between the substrate 110 and the semiconductor layers 112 and 114 according to an exemplary embodiment of the present invention. The buffer layer 116 may reduce or prevent impurities from being diffused between the substrate 110 and the semiconductor layers 112 and 114. The buffer layer 116 may be a thin layer formed on the substrate 110 to planarize the surface of the substrate 110.

The gate insulating layer 120 including a plurality of layers may be formed on the semiconductor layers 112 and 114 and a gate wiring 130, the driving voltage lines 140, 142, and 144, and the data lines 150, 152, and 154 may be formed on the gate insulating layer 120 of different layers. Forming the gate wiring 130, the driving voltage lines 140, 142, and 144, and the data lines 150, 152, and 154 will be described below in more detail below with reference to FIG. 1 in which a stacked structure of the display apparatus according to an exemplary embodiment of the present invention is schematically illustrated.

As illustrated in FIG. 1, a first gate insulating layer 122 may be formed on the semiconductor layers 112 and 114 and a second gate insulating layer 124 may be formed on the first gate insulating layer 122. A third gate insulating layer 126 may be formed on the second gate insulating layer 124. The gate insulating layer 120 including the first gate insulating layer 122, the second gate insulating layer 124 and the third gate insulating layer 126 according to an exemplary embodiment of the present invention may include an electrical insulating material including ceramics such as silicon nitride ($SiN_x$) or silicon oxide $SiO_2$, but exemplary embodiments of the present invention are not limited thereto.

According to an exemplary embodiment of the present invention, a first gate wiring 132 overlapping with the channel area 112a of the first semiconductor layer 112 may be formed between the first gate insulating layer 122 and the second gate insulating layer 124 and a second gate wiring 134 overlapping the channel area 114a of the second semiconductor layer 114 may be formed between the second gate insulating layer 124 and the third gate insulating layer 126.

The first gate wiring 132 and the second gate wiring 134 may be formed on different layers but may be disposed along a direction parallel with each other. That is, when viewing the first gate wiring 132 and the second gate wiring 134 from a top plan view, the first gate wiring 132 and the second gate wiring 134 may be parallel with each other.

The first gate wiring 132 according to an exemplary embodiment of the present invention may be formed on the first gate insulating layer 122 and the second gate wiring 134 may be formed on the second gate insulating layer 124 and thus the first gate wiring 132 and the second gate wiring 134 may be formed on different layers. According to an exemplary embodiment of the present invention, when the gate wirings are formed on different layers, a distance between adjacent gate wirings 130 may be formed to be narrow, and thus the display apparatus having higher resolution may be realized.

The driving voltage lines 140, 142, and 144 and the data lines 150, 152, and 154 which may intersect with the first gate wirings 132 and the second gate wirings 134, respectively, may be formed on the third gate insulating layer 126. The driving voltage lines 140, 142, and 144 and the data lines 150, 152, and 154 may each be formed on the same layer or different layers. The driving voltage lines 140, 142, and 144 and the data lines 150, 152, and 154 may each be formed on the third gate insulating layer 126.

The display apparatus according to an exemplary embodiment of the present invention may include a plurality of driving voltage lines 140, 142, and 144 and a plurality of data lines 150, 152, and 154. The driving voltage lines 140, 142, and 144 and the data lines 150, 152, and 154 may be connected to the source electrodes and the drain electrodes of different thin film transistors.

The driving voltage lines 140, 142, and 144 and the data lines 150, 152, and 154 according to an exemplary embodiment of the present invention may be formed on the same layer or different layers and may be disposed independently from each other. When viewed from a top plan view, the first gate wiring 132 and the second gate wiring 134, the plurality of driving voltage lines 140, 142, and 144 and the data lines 150, 152, and 154 may be parallel with each other.

According to an exemplary embodiment of the present invention, the first gate wiring 132 and the second gate wiring 134 disposed in parallel toward a first direction and the driving voltage lines 140, 142, and 144 and the data lines 150, 152, and 154 disposed in parallel toward another direction intersecting the first direction may form a matrix.

The thin film transistor may be formed in a position overlapping with an intersecting area of the first gate wiring 132, the second gate wiring 134, the driving voltage lines 140, 142, and 144, and the data lines 150, 152, and 154. The thin film transistor may be formed in each pixel of the display apparatus according to exemplary embodiments of the present invention. The first gate wiring 132 and the second gate wiring 134 according to an exemplary embodiment of the present invention may be electrically connected to the gate electrode of the thin film transistor and the driving voltage lines 140, 142, and 144. The data lines 150, 152, and 154 may he electrically connected to the source electrode and the drain electrode of the thin film transistor.

One pixel may include a plurality of thin film transistors. Thus, the interval between the first gate wiring 132, the second gate wiring 134, the driving voltage lines 140, 142, 144, and the data lines 150, 152, and 154 according to an exemplary embodiment of the present invention may be relatively narrow.

When the interval between the wirings is relatively narrow, and the third gate insulating layer 126 is formed on the first gate wiring 132 and the second gate wiring 134, a valley may be formed on the third gate insulating layer 126 formed between the gate wirings 130 due to the thickness of the gate wiring 130.

To form the driving voltage lines 140, 142, and 144 or the data lines 150, 152, and 154, a conductive material might not be sufficiently removed from the surface of the third gate insulating layer 126 in a process of applying and etching the conductive material. When the conductive material remains in the valley formed between the first gate wiring 132 and the second gate wiring 134, a short circuit may occur between the driving voltage lines 140, 142, and 144 and the data lines 150, 152, and 154.

The occurrence of the short circuit between the driving voltage lines 140, 142, and 144 and the data lines 150, 152, and 154 may be reduced or prevented in a high resolution display apparatus in which the interval between the wirings is reduced. The display apparatus according to an exemplary embodiment of the present invention may include the short circuit protection area 160.

The short circuit protection area 160 according to an exemplary embodiment of the present invention may be an area formed on a portion of the third gate insulating layer 126 and may have a boundary formed by the first gate wiring 132, the second gate wiring 134, the driving voltage lines 140, 142, and 144, and the data lines 150, 152, and 154. The short circuit protection area 160 may be any of the areas having a matrix form formed by the first gate wiring 132, the second gate wiring 134, the driving voltage lines 140, 142, and 144, and the data lines 150, 152, and 154 which intersect with each other.

An interval d2 between the first gate wiring 132 and the second gate wiring 134 in the short circuit protection area 160 according to an exemplary embodiment of the present invention may be larger than an interval d1 between the first gate wiring 132 and the second gate wiring 134 outside of the short circuit protection area 160.

According to an exemplary embodiment of the present invention the short circuit protection area 160 may have the interval d2 between the first gate wiring 132 and the second gate wiring 134 in the short circuit protection area 160 which may be larger than the interval d1 between the first gate wiring 132 and the second gate wiring 134 outside of the short circuit protection area 160.

The interval between the first gate wiring 132 and the second gate wiring 134 outside of the short circuit protection area 160 may be the interval d1 between the wirings disposed parallel with each other when these wirings are projected on a plane. The interval d2 between the first gate wiring 132 and the second gate wiring 134 in the short circuit protection area 160 may be an average value or a maximum value of the interval measured by projecting these wirings on the plane.

As illustrated in FIG. 2, in an exemplary embodiment of the present invention, when the interval d2 between the first gate wiring 132 and the second gate wiring 134 in the short circuit protection area 160 is larger than the interval d1 between the first gate wiring 132 and the second gate wiring 134 outside of the short circuit protection area 160, the gate wirings 130 may gradually approach each other and the occurrence of the valley in the third gate insulating layer 126 may be reduced or prevented.

Thus, the occurrence of the short circuit between the driving voltage lines 140, 142, and 144 and the data lines 150, 152, and 154 formed on the third gate insulating layer 126 may be reduced or prevented.

As illustrated in FIG. 1, the display apparatus according to an exemplary embodiment of the present invention may include a capacitor 180. The capacitor 180 may include a lower electrode 182 and an upper electrode 184, which may face each other. According to an exemplary embodiment of the present invention, the lower electrode 182 may be formed on the second gate insulating layer 124 and the upper electrode 184 may be formed on the third gate insulating layer 126.

These lower electrode 182 and upper electrode 184 each may be formed on the same layer by the same process as the second gate wiring 134 and the driving voltage lines 140, 142, and 144, and the data lines 150, 152, and 154 which may be formed on the second gate insulating layer 124 and the third gate insulating layer 126.

According to an exemplary embodiment of the present invention, the third gate insulating layer 126 may be formed between the upper electrode 184 and the lower electrode 182. Thus, the third gate insulating layer 126 may serve as a dielectric layer.

After the capacitor 180 is formed, the interlayer insulating layer may be formed on the capacitor 180 and the display panel capable of displaying an image by controlling an electrical signal using the thin film transistor and the capacitor 180 may be formed thereon.

When the display apparatus according to an exemplary embodiment of the present invention is an organic light emitting display, a passivation layer may be formed on the interlayer insulating layer and a barrier rib opening may be formed in a pixel area. A pixel electrode may be formed in the opened pixel area. The display apparatus may include an organic emission layer, and a common electrode may be formed on the passivation layer.

However, the display apparatus according to an exemplary embodiment of the present invention is not limited to the organic light emitting device, and display apparatuses displaying an image by various methods may be used.

The display apparatus according to another exemplary embodiment of the present invention may include a stepped part 170 formed within the short circuit protection area 160.

Figure 3:
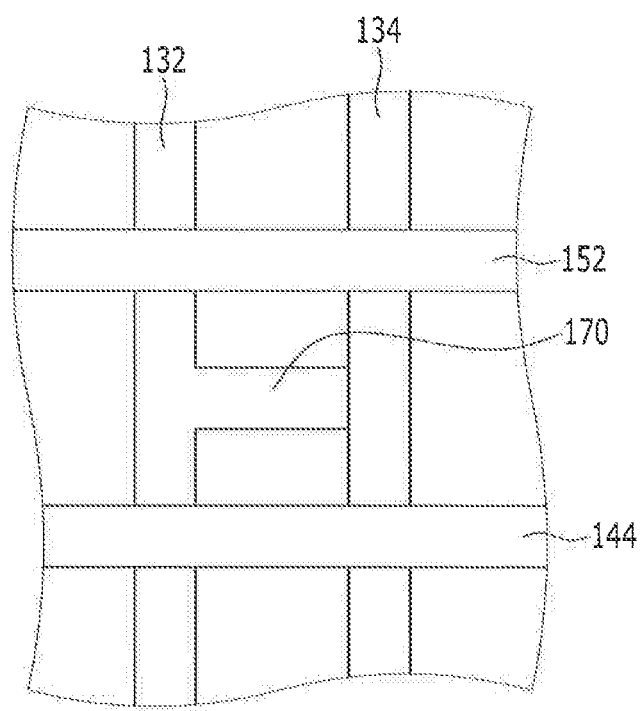
FIG. 3 is a plan view schematically illustrating a short circuit protection area according to another exemplary embodiment of the present invention.
Figure 4:
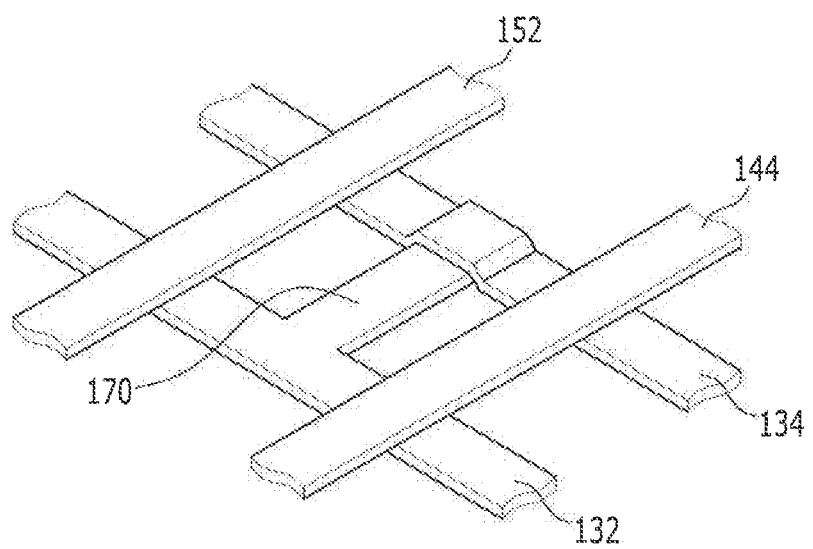
FIG. 4 is a perspective view of the short circuit protection area of FIG. 3.
Figure 5:
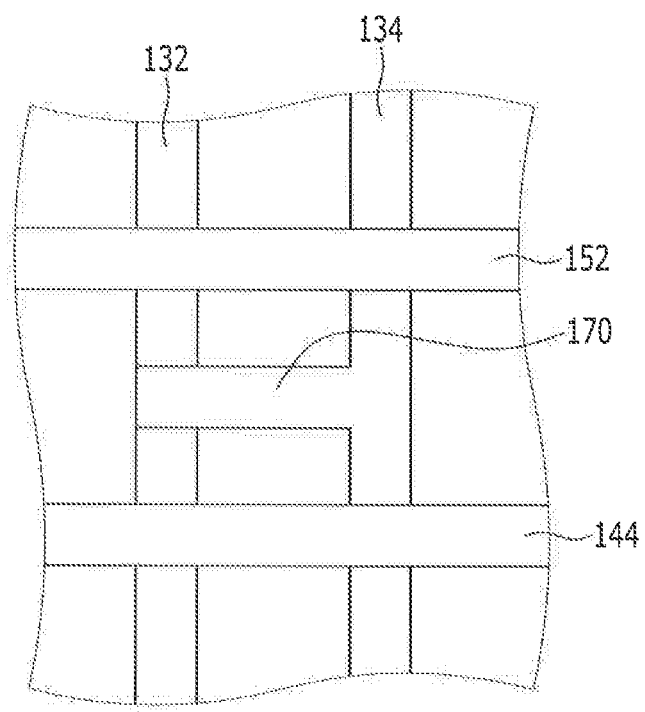
FIG. 5 is a diagram schematically illustrating a short circuit protection area according to another exemplary embodiment of the present invention.
Figure 6:
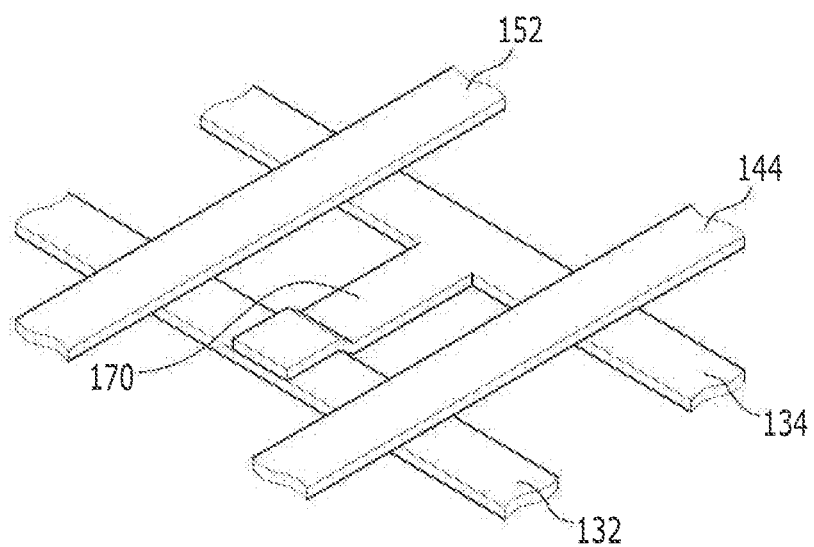
FIG. 6 is a perspective view of the short circuit protection area of FIG. 5.

FIG. 3 is a plan view schematically illustrating a short circuit protection area 160 according to another exemplary embodiment of the present invention. FIG. 4 is a perspective view of the short circuit protection area of FIG. 3. FIG. 5 is a diagram schematically illustrating a short circuit protection area according to another exemplary embodiment of the present invention. FIG. 6 is a perspective view of the short circuit protection area of FIG. 5. The gate insulating layer may be omitted according to exemplary embodiments of the present invention. The first gate wiring 132, the second gate wiring 134, the driving voltage lines 140, 142, and 144, and the data lines 150, 152, and 154 according to exemplary embodiments of the present invention are schematically illustrated in FIGS. 3-6.

The stepped part 170 may protrude from any one of the first gate wiring 132 and the second gate wiring 134 and a step may be formed on the third gate insulating layer 126 formed thereon.

The stepped part 170 according to an exemplary embodiment of the present invention may protrude from any one of the first gate wiring 132 and the second gate wiring 134. The stepped part 170 may include the same material as the first gate wiring 132 and the second gate wiring 134.

The stepped part 170 according to another exemplary embodiment of the present invention protruding from the first gate wiring 132 will be described in more detail below with reference to FIGS. 3 and 4.

The first gate wiring 132 may be formed below the second gate wiring 134, and thus, the stepped part 170 protruding from the first gate wiring 132 may be formed below the second gate wiring 134. Due to the thickness of the stepped part 170, the second gate insulating layer 124 and the second gate wiring 134 disposed on the stepped part 170 as illustrated in FIG. 4 may have a step over the stepped part 170. Thus, the third gate insulating layer 126 formed on the second gate wiring 134 may also have a step.

When the step is formed in the short circuit protection area 160 of the third gate insulating layer 126 by the stepped part 170 according to an exemplary embodiment of the present invention, an occurrence of a valley in the third gate insulating layer 126 may be reduced or prevented by the step, which may protrude upward. Thus, an occurrence of a short circuit between the driving voltage lines 140, 142, and 144 and the data lines 150, 152, and 154 formed on the third gate insulating layer 126 may be reduced or prevented.

The stepped part 170 according to another exemplary embodiment of the present invention protruding from the second gate wirings 134 will be described in more detail below with reference to FIGS. 5 and 6.

The second gate wiring 134 may be formed above the first gate wiring 132, and thus the stepped part 170 protruding from the second gate wiring 134 may be formed on the first gate wiring 132. Due to the thickness of the first gate wiring 132, the stepped part 170 formed on the first gate wiring 132, as illustrated in FIG. 6 for example, may have a step over the first gate wiring 132. Thus, the third gate insulating layer 126 formed on the stepped part 170 may also have a step.

When the step is formed in the short circuit protection area 160 of the third gate insulating layer 126 by the stepped part 170, an occurrence of a valley in the third gate insulating layer 126 may be reduced or prevented by the step formed to protrude upward. An occurrence of a short circuit between the driving voltage lines 140, 142, and 144 and the data lines 150, 152, and 154 formed on the third gate insulating layer 126 may be reduced or prevented.

The display apparatus according to an exemplary embodiment of the present invention will be described in more detail below. According to an exemplary embodiment of the present invention, the stepped part 170 which may increase the interval between the first gate wiring 132 and the second gate wiring 134 in the short circuit protection area 160 or which may form the step in the short circuit protection area 160 may be provided, and thus an occurrence of a short circuit due to the reduction in the interval between the gate wirings 130 may be reduced or prevented.

Figure 7:
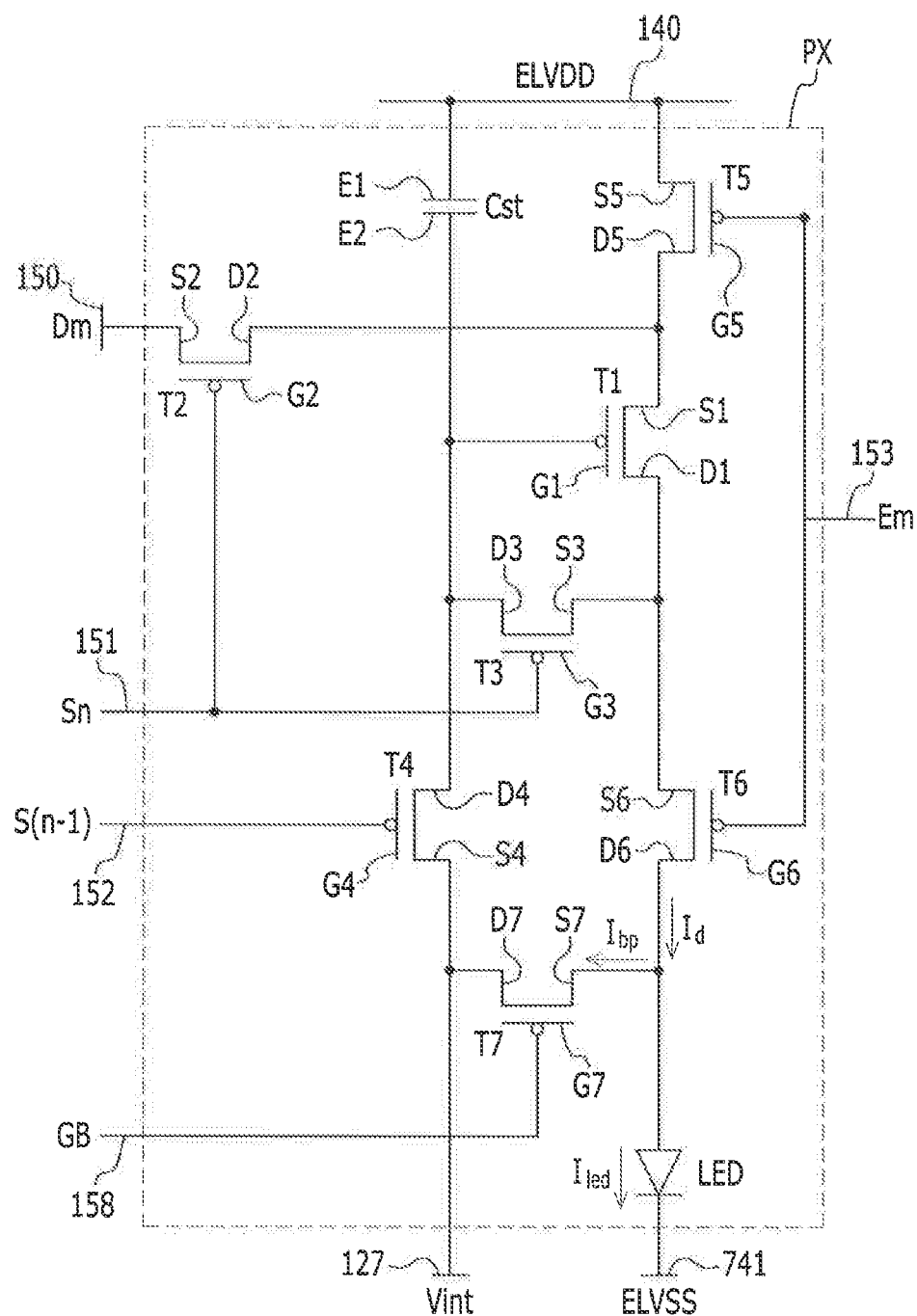
FIG. 7 is an equivalent circuit diagram of a pixel of a display device according to an exemplary embodiment of the present invention.

FIG. 7 is an equivalent circuit diagram of a pixel of a display device according to an exemplary embodiment the present invention.

Referring to FIG. 7, a pixel PX of the display device includes a plurality of transistors connected to a plurality of signal lines, a storage capacitor Cst, and a light emitting diode LED.

The display device includes a display area for displaying an image, and such pixels PX are arranged in various ways (e.g., a matrix) in the display area.

The transistors include a driving transistor T1 switching transistors (e.g., a second transistor T2 and a third transistor T3) connected with a scan line 151, and other transistors (hereinafter referred to as "compensation transistors") for performing an operation required to operate the light emitting diode LED. For example, in an exemplary embodiment, the compensation transistors may include a fourth transistor T4, a fifth transistor T5, a sixth transistor T6, and a seventh transistor T7. The plurality of signal lines may include the scan line 151, a previous-stage scan line 152, a light emission control line 153, a bypass control line 158, a data line 150, a driving voltage line 140, an initialization voltage line 127, and a common voltage line 741. The bypass control line 158 may be a portion of the previous-stage scan line 152, or may be electrically connected to the previous-stage scan line 152.

The scan line 151 is connected to a gate driver to transfer a scan signal Sn to the second transistor T2 and the third transistor T3. The previous-stage scan line 152 is connected to the gate driver, and transfers a previous-stage scan signal S(n-1) to the fourth transistor T4. The light emission control line 153 is connected to an emission controller and transfers a light emission control signal EM to the fifth transistor T5 and the sixth transistor T6 for controlling a light emission time of the light emitting diode LED. The bypass control line 158 transfers a bypass signal GB to the seventh transistor T7.

The data line 150 is a wire for transferring a data voltage Dm generated by a data driver, and a luminance of the light emitting diode LED (also referred to as "a light emitting element") that emits light varies depending on the data voltage Dm. The driving voltage line 140 applies a driving voltage ELVDD, the initialization voltage line 127 transfers a initialization voltage Vint for initializing the driving transistor T1, and the common voltage line 741 applies a common voltage ELVSS. Constant voltages are respectively applied to the driving voltage line 140, the initialization voltage line 127, and the common voltage line 741.

The driving transistor T1 adjusts the magnitude of a driving current $I_d$ that is output depending on the data voltage Dm applied to the driving transistor T1, and the driving current $I_d$ output therefrom is applied to the light emitting diode LED (e.g., an organic light emitting diode, etc.) to adjust the brightness of the light emitting diode LED depending on the data voltage Dm. For this purpose, a first electrode S1 of the driving transistor T1 is configured to receive the driving voltage ELVDD, and is connected to the driving voltage line 140 through the fifth transistor T5. In addition, the first electrode S1 of the driving transistor T1 is also connected to a second electrode D2 of the second transistor T2 so that the data voltage Dm is also applied to the first electrode S1. A second electrode D1 of the driving transistor T1, which is an output side electrode, is configured to output the driving current $I_d$ toward the light emitting diode LED, and is connected to an anode of the light emitting diode LED through the sixth transistor T6. A gate electrode G1 of the driving transistor T1 is connected to a second electrode E2 of the storage capacitor Cst. Accordingly, a voltage of the gate electrode G1 varies depending on a voltage stored in the storage capacitor Cst, and thus the driving current $I_d$ output by the driving transistor T1 varies depending on the voltage stored in the storage capacitor Cst.

The second transistor T2 receives the data voltage Dm and may transfer the data voltage Dm into the pixel PX. A gate electrode G2 of the second transistor T2 is connected to the scan line 151, and a first electrode S2 of the second transistor T2 is connected to the data line 150. The second electrode D2 of the second transistor T2 is connected to the first electrode S1 of the driving transistor T1. When the second transistor T2 is turned on depending on the scan signal Sn transferred through the scan line 151, the data voltage Dm transferred through the data line 150 is transferred to the first electrode S1 of the driving transistor T1.

The third transistor T3 transfers a compensated voltage Dm+Vth to the second storage electrode E2 of the storage capacitor Cst. The compensated voltage Dm+Vth is a voltage applied to the gate electrode G1 when the data voltage Dm is applied to the first electrode S1. The amount of the compensated voltage Dm+Vth corresponds to the sum of the data voltage Dm and the threshold voltage Vth of the driving transistor T1. A gate electrode G3 of the third transistor T3 is connected to the scan line 151, and a first electrode S3 of third transistor T3 is connected to the second electrode D1 of the driving transistor T1. A second electrode D3 of the third transistor T3 is connected to the second storage electrode E2 of the storage capacitor Cst and the gate electrode G1 of the driving transistor T1.

The third transistor T3 is turned on depending on the scan signal Sn transferred through the scan line 151 and connects the gate electrode G1 and the second electrode D1 of the driving transistor T1 and connects the second electrode D1 of the driving transistor T1 and the second storage electrode E2 of the storage capacitor Cst when the third transistor T3 is turned on.

The fourth transistor T4 initializes the gate electrode G1 of the driving transistor T1 and the second storage electrode E2 of the storage capacitor Cst. A gate electrode G4 is connected to the previous-stage scan line 152, and a first electrode S4 of the fourth transistor T4 is connected to the initialization voltage line 127. A second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transfers the initialization voltage Vint to the gate electrode G1 of the driving transistor T1 and the second storage electrode E2 of the storage capacitor Cst depending on the previous-stage scan signal S(n-1) transferred through the previous-stage scan line 152. Thus, the voltage of the gate electrode G1 of the driving transistor T1 and the second storage electrode E2 of the storage capacitor Cst is initialized. In an exemplary embodiment, the initialization voltage Vint may be a voltage that has a low voltage value to turn on the driving transistor T1.

The fifth transistor T5 transfers the driving voltage ELVDD to the driving transistor T1. A gate electrode G5 of the fifth transistor T5 is connected to the light emission control line 153, and a first electrode S5 of the fifth transistor T5 is connected to the driving voltage line 140. A second electrode D5 of the fifth transistor T5 is connected to the first electrode S1 of the driving transistor T1.

The sixth transistor T6 transfers the driving current $I_d$ output from the driving transistor T1 to the light emitting diode LED. A gate electrode G6 of the sixth transistor T6 is connected to the light emission control line 153, and a first electrode S6 of the sixth transistor T6 is connected to the second electrode D1 of the driving transistor T1. A second electrode D6 of the sixth transistor T6 is connected to the anode of the light emitting diode LED.

The fifth transistor T5 and the sixth transistor T6 are simultaneously turned on depending on the light emission control signal EM transferred through the light emission control line 153, and when the driving voltage ELVDD is applied to the first electrode S1 of the driving transistor T1 through the fifth transistor T5, the driving transistor T1 outputs the driving current $I_d$ depending on the voltage of the gate electrode G1 of the driving transistor T1 (e.g., the voltage of the second storage electrode E2 of the storage capacitor Cst). The output driving current $I_d$ is transferred to the light emitting diode LED through the sixth transistor T6. The light emitting diode LED emits light as a current $I_{led}$ flows through the light emitting diode LED. A part of the driving current $I_d$ (e.g., a bypass current $I_{bp}$) flows to a second electrode D7 of the seventh transistor T7 and the remaining current of the driving current $I_d$ (e.g., current $I_{led}$) flows to the anode of the light emitting diode LED.

The seventh transistor T7 initializes the anode of the light emitting diode LED. A gate electrode G7 of the seventh transistor T7 is connected to the bypass control line 158. The first electrode S7 of the seventh transistor T7 is connected to the anode of the light emitting diode LED, and a second electrode D7 of the seventh transistor T7 is connected to the initialization voltage line 127. In an exemplary embodiment, the bypass control line 158 may be connected to the previous-stage scan line 152, and a signal having the same timing as the scan signal S(n-1) may be applied to the bypass control line 158 as a bypass signal GB. In another exemplary embodiment, the bypass control line 158 may not be connected to the previous-stage scan line 152, and may transfer a separate signal (e.g., bypass signal GB) from the previous-stage scan signal S(n-1). When the seventh transistor T7 is turned on depending on the bypass signal GB, the initialization voltage Vint is applied to the anode of the light emitting diode LED and the light emitting diode LED is initialized.

A first storage electrode E1 of the storage capacitor Cst is connected to the driving voltage line 140. The second storage electrode E2 is connected to the gate electrode G1 of the driving transistor T1, the second electrode D3 of the third transistor T3, and the second electrode D4 of the fourth transistor T4. As a result, the second storage electrode E2 determines the voltage of the gate electrode G1 of the driving transistor T1, and receives the data voltage Dm through the second electrode D3 of the third transistor T3 or the initialization voltage Vint through the second electrode D4 of the fourth transistor T4.

The anode of the light emitting diode LED is connected to the second electrode D6 of the sixth transistor T6 and the first electrode S7 of the seventh transistor T7, and the cathode is connected to the common voltage line 741 which transfers the common voltage ELVSS.

In the exemplary embodiment of FIG. 7, the pixel circuit includes seven transistors T1 to T7 and one capacitor Cst. However, exemplary embodiments of the present inventive concepts are not limited thereto. The numbers of the transistors and the capacitors and connections therebetween may be variously modified. While the seven transistors T1 to T7 shown in the exemplary embodiment of FIG. 7 are single gate electrodes, in other exemplary embodiments at least one of the transistors may have a dual gate electrode, etc.

Hereinafter, an operation of one pixel of a display device according to an exemplary embodiment of the present invention will be described with reference to FIG. 7.

The previous-stage scan signal S(n-1) of a low level is supplied to the pixel PX through the previous-stage scan line 152 during an initialization period. The fourth transistor T4 that receives the previous-stage scan signal S(n-1) having a low level is turned on to apply the initialization voltage Vint to the gate electrode G1 of the driving transistor T1 and the second storage electrode E2 of the storage capacitor Cst through the fourth transistor T4. As a result, the driving transistor T1 and the storage capacitor Cst are initialized. The initialization voltage Vint has a low value to turn on the driving transistor T1.

During the initialization period, a low level bypass signal GB is also applied to the seventh transistor T7. The seventh transistor T7 receiving the low level bypass signal GB is turned on to apply the initialization voltage Vint to the anode of the light emitting diode LED through the seventh transistor T7. As a result, the anode of the light emitting diode LED is also initialized.

The scan signal Sn of a low level is applied to the pixel PX through the scan line 151 during a data writing period. The second transistor T2 and the third transistor T3 are turned on by the scan signal Sn of the low level. In an exemplary embodiment, the scan signal Sn may include a plurality of low level signals for one frame.

When the second transistor T2 is turned on, the data voltage Dm is applied through the second transistor T2 to the first electrode S1.

In addition, the third transistor T3 is turned on during the data writing period, and as a result, the second electrode D1 of the driving transistor T1 is electrically connected to the gate electrode G1 and the second storage electrode E2 of the storage capacitor Cst. The gate electrode G1 and the second electrode D1 of the driving transistor T1 are diode-connected. In addition, the driving transistor T1 is turned on because a low voltage (e.g., the initialization voltage Vint) is applied to the gate electrode G1 during the initialization period. As a result, the data voltage Dm applied to the first electrode S1 through T2 is in turn applied through the channel of the driving transistor T1 to the second electrode D1, and then is stored in the second storage electrode E2 of the storage capacitor Cst through the third transistor T3.

In this embodiment, the voltage applied to the second storage electrode E2 may vary depending on the threshold voltage Vth of the driving transistor T1. When the data voltage Dm is applied to the first electrode S1 of the driving transistor T1 and the initialization voltage Vint is applied to the gate electrode G1 of the driving transistor T1, the voltage output into the second electrode D1 may have a value of Vgs+Vth. Vgs indicates a difference between voltages applied to the gate electrode G1 and the first electrode S1 of the driving transistor T1, and may have a value of Dm−Vint. Therefore, the voltage that is output from the second electrode D1 and is stored in the second storage electrode E2 may have a value of Dm−Vint+Vth.

Thereafter, during an emission period, the light emission control signal EM supplied from the light emission control line 153 has a value of a low level to turn on the fifth transistor T5 and the sixth transistor T6. As a result, the driving voltage ELVDD is applied to the first electrode S1 of the driving transistor T1, and the second electrode D1 of the driving transistor T1 is connected to the light emitting diode LED. The driving transistor T1 generates the driving current $I_d$ according to the voltage difference Vgs between the voltage of the gate electrode G1 and the voltage of the first electrode S1 (e.g., the driving voltage ELVDD). The driving current $I_d$ of the driving transistor T1 may have a value proportional to a square of Vgs−Vth. In an exemplary embodiment, the value of Vgs is equal to a difference of the voltages applied to opposite ends of the storage capacitor Cst, and Vgs has a value of Vg−Vs, and thus it has a value of Dm−Vint+Vth−ELVDD. In an exemplary embodiment, the value of Vgs−Vth is obtained by subtracting the value of Vth, and it has a value of Dm−Vint−ELVDD. The driving current $I_d$ of the driving transistor T1 has a current irrespective of the threshold voltage Vth of the driving transistor T1 as an output.

Accordingly, even when the driving transistor T1 disposed in each pixel PX has a different threshold voltage Vth due to process dispersion, an output current of the driving transistor T1 is made constant, thereby reducing non-uniformity in electrical characteristics.

In the above equation, the value of Vth may be slightly larger than 0 or a negative value in the case of a P-type transistor using a polycrystalline semiconductor. Further, the expression of "+" and "−" may be changed depending on a direction in which the voltage is calculated. However, the driving current $I_d$, which is the output current of the driving transistor T1, may have a value independent from the value of the threshold voltage Vth.

When the above-mentioned emitting period ends, the initialization period starts again, and the same operation is repeated from the beginning.

Each of the first electrode and the second electrode of each of the transistors T1, T2, T3, T4, T5, T6, and T7 may be a source electrode or a drain electrode depending on the direction in which a voltage or a current is applied.

Hereinafter, a pixel of a light emitting diode display illustrated in FIG. 7 will be described in detail with reference to FIG. 8 and FIG. 9.

Figure 8:
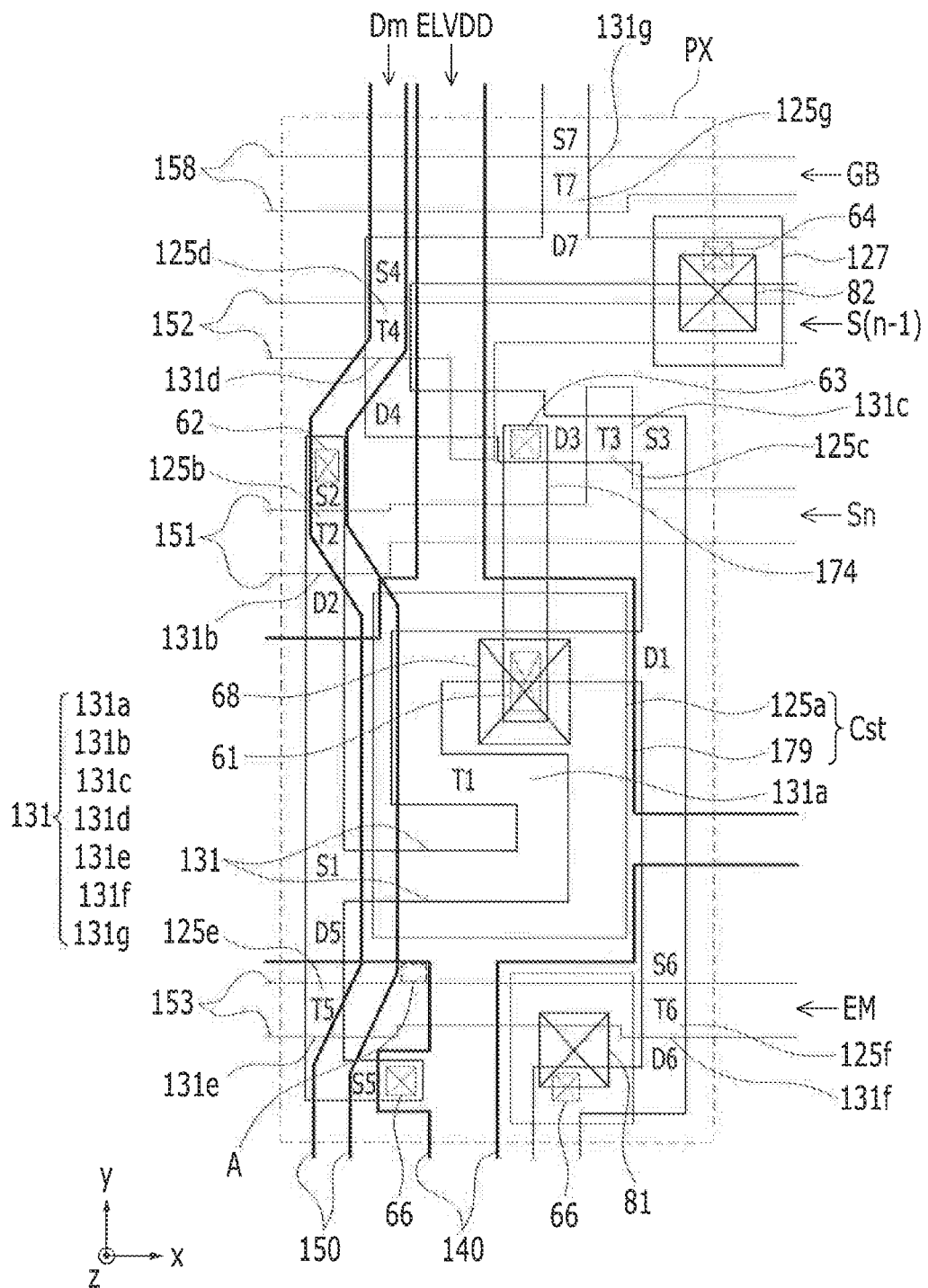
FIG. 8 is a top plan view of a display device according to an exemplary embodiment of the present invention.
Figure 9:
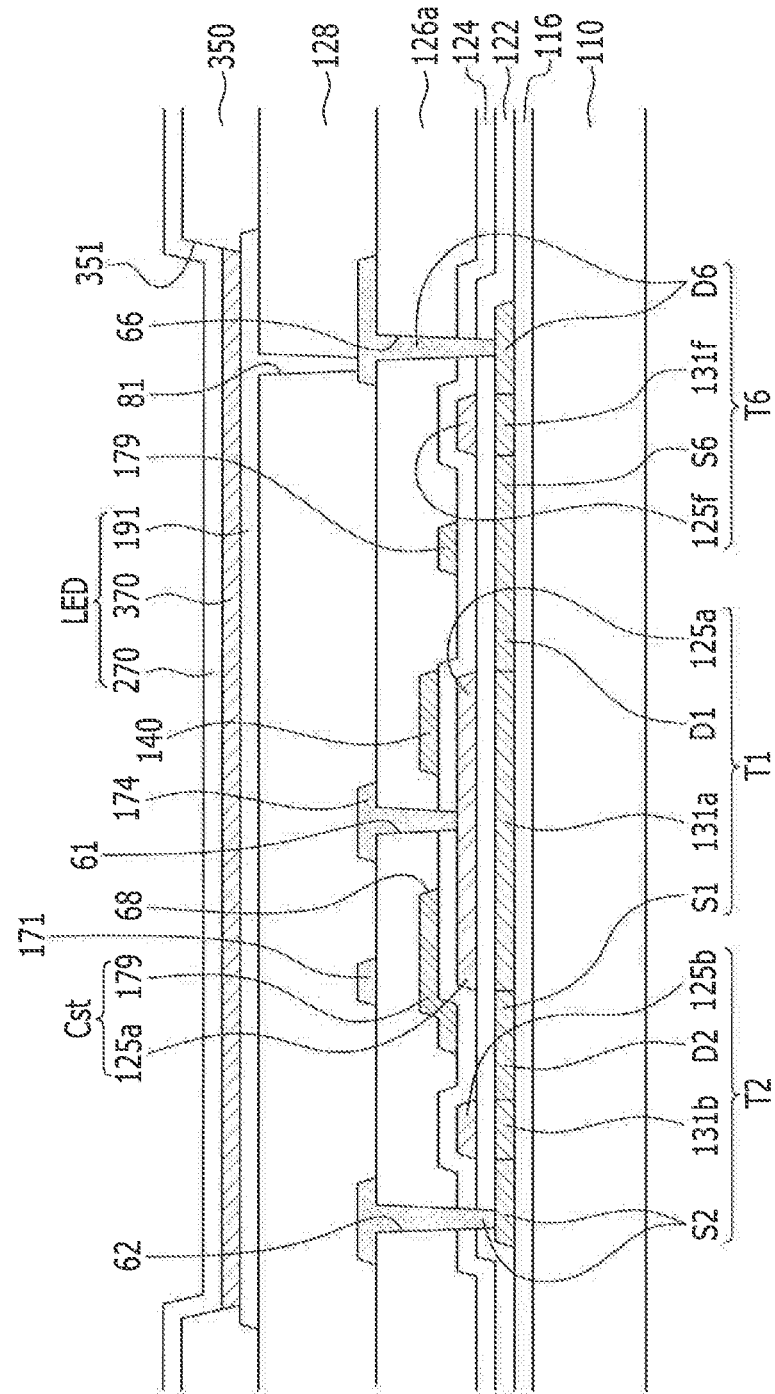
FIG. 9 is a cross-sectional view of a display device according to an exemplary embodiment of the present invention.

FIG. 8 is a top plan view of a display device according to an exemplary embodiment, and FIG. 9 illustrates a cross-sectional view of the display device.

Firstly, as shown in FIG. 8, the pixel PX of the display device according to an exemplary embodiment of the present inventive concepts includes the driving transistor T1, the switching transistor T2, the third transistor T3, the fourth transistor T4, the fifth transistor T5, the sixth transistor T6, the seventh transistor T7, the storage capacitor Cst, and the light emitting diode (LED). The first through seventh transistors T1, T2, T3, T4, T5, T6, and T7 are formed according to the semiconductor layer 131. The semiconductor layer 131 includes a driving semiconductor layer 131a formed at the driving transistor T1, a switching semiconductor layer 131b formed at the switching transistor T2, a compensation semiconductor layer 131c formed at the third transistor T3, an initialization semiconductor layer 131d formed at the fourth transistor T4, an operation control semiconductor layer 131e formed at the fifth transistor T5, a light emission control semiconductor layer 131f formed at the sixth transistor T6, and a bypass semiconductor layer 131g formed at the bypass thin film transistor T7.

The driving transistor T1 includes the driving semiconductor layer 131a, a driving gate electrode 125a, a driving source electrode S1, and a driving drain electrode D1.

In an exemplary embodiment, the driving semiconductor layer 131a is bent. For example, the driving semiconductor layer 131a may have a zigzag shape, and may be disposed with a "S" shape. However, exemplary embodiments of the present inventive concepts are not limited thereto. As described above, by forming the driving semiconductor layer 131a of the curved shape, a long driving semiconductor layer 131a may be formed in a narrow space. Accordingly, a long driving channel region of the driving semiconductor layer 131a may be formed such that a driving range of the gate voltage applied to the driving gate electrode 125a is broadened. Therefore, since the driving range of the gate voltage is broad, a grayscale of light emitted from an light emitting diode (LED) can be more finely controlled by changing the magnitude of the gate voltage, and as a result, it is possible to increase the resolution of the light emitting diode display and improve display quality. By varying the shape of the driving semiconductor layer 131a, various exemplary embodiments of "ㄹ", "S", "M", and "W" shapes are possible.

The driving source electrode S1 of the first transistor T1 may correspond to the driving source region S1 doped with the impurity in the driving semiconductor layer 131a, and the driving drain electrode D1 may correspond to the driving drain region D1 doped with the impurity in the driving semiconductor layer 131a. The driving gate electrode 125a overlaps the driving semiconductor layer 131a (e.g., in the Z direction), and the driving gate electrode 125a is formed with the same layer as the scan line 151, the previous-stage scan line 152, the light emission control line 153, a switching gate electrode 125b, a compensation gate electrode 125c, an initialization gate electrode 125d, an operation control gate electrode 125e, and a light emission control gate electrode 125f.

The switching transistor T2 includes the switching semiconductor layer 131b, the switching gate electrode 125b, a switching source electrode S2, and a switching drain electrode D2. The switching source electrode S2 as a portion of the data line 150 is connected to the switching semiconductor layer 131b through an opening 62 and is simultaneously connected to the data line 150. The switching drain electrode D2 corresponds to the switching drain region doped with the impurity in the switching semiconductor layer 131b.

The third transistor T3 includes the compensation semiconductor layer 131c, the compensation gate electrode 125c, a compensation source electrode S3, and a compensation drain electrode D3. The compensation source electrode S3 corresponds to the compensation source region doped with the impurity in the compensation semiconductor layer 131c, and the compensation drain electrode D3 corresponds to the compensation drain region doped with the impurity.

The fourth transistor T4 includes the initialization semiconductor layer 131d, the initialization gate electrode 125d, an initialization source electrode S4, and an initialization drain electrode D4. The initialization source electrode S4 corresponds to the initialization source region doped with the impurity and the initialization drain electrode D4 corresponds to the initialization drain region doped with the impurity.

The fifth transistor T5 includes the operation control semiconductor layer 131e, the operation control gate electrode 125e, an operation control source electrode S5, and an operation control drain electrode D5. The operation control source electrode S5 as a portion of the driving voltage line 140 is connected to the operation control semiconductor layer 131e through an opening 65, and the operation control drain electrode D5 corresponds to the operation control drain region doped with the impurity in the operation control semiconductor layer 131e.

The sixth transistor T6 includes the light emission control semiconductor layer 131f, the light emission control gate electrode 125f, a light emission control source electrode S6, and a light emission control drain electrode D6. The light emission control source electrode S6 corresponds to the light emission control source region doped with the impurity in the light emission control semiconductor layer 131f, and the light emission control drain electrode D6 is connected to the light emission control semiconductor layer 131f through an opening 66.

The bypass thin film transistor T7 includes the bypass semiconductor layer 131g, a bypass gate electrode 125g, a bypass source electrode S7, and a bypass drain electrode D7. The bypass source electrode S7 corresponds to the bypass source region doped with the impurity in the bypass semiconductor layer 131g, and the bypass drain electrode D7 corresponds to the bypass drain region doped with the impurity in the bypass semiconductor layer 131g. The bypass source electrode S7 is directly connected to the light emission control drain region 133f.

An end of the driving semiconductor layer 131a of the driving transistor T1 is connected to the switching semiconductor layer 131b and the compensation semiconductor layer 131c, and the other end of the driving semiconductor layer 131a is connected to the operation control semiconductor layer 131e and the light emission control semiconductor layer 131f. Therefore, the driving source electrode S1 is connected to the switching drain electrode D2 and the operation control drain electrode D5, and the driving drain electrode D1 is connected to the compensation source electrode S3 and the light emission control source electrode S6.

The storage capacitor Cst includes a first electrode 179 and a second electrode and is disposed via a second gate insulating layer 124 interposed therebetween. In an exemplary embodiment, the first electrode 179 is an enlarged portion of the driving voltage line 140, the second electrode is the driving gate electrode 125a. The second gate insulating layer 124 becomes a dielectric material, and the storage capacitance is determined by charges charged in the storage capacitor Cst and the voltage between two storage electrodes.

The second electrode as the driving gate electrode passes through a capacitive opening 68 formed at the first electrode 179, and is connected to a connector 174 through an opening 61 formed in the second gate insulating layer 124 and an interlayer insulating layer, such as the first gate insulating layer 126. In an exemplary embodiment, the connector 174 is parallel to and is formed with the same layer as the data line 150, and connects the driving gate electrode 125a and the compensation semiconductor layer 131c of the compensation thin film transistor T3.

The connector 174 is connected to the compensation semiconductor layer 131c of the compensation thin film transistor T3 through an opening 63 formed in the first gate insulating layer 122, the second gate insulating layer 124 and an interlayer insulating layer 126a.

Accordingly, the storage capacitor Cst stores a storage capacitance corresponding to a difference between the driving voltage ELVDD transmitted to the first electrode 179 through the driving voltage line 140 and the gate voltage of the driving gate electrode 125a.

The switching transistor T2 is used as a switching element for selecting a pixel that is to emit light. The switching gate electrode 125b is connected to the scan line 151, the switching source electrode S2 is connected to the data line 150, and the switching drain electrode D2 is connected to the driving transistor T1 and the fifth transistor T5. The light emission control drain electrode D6 of the sixth transistor T6 is directly connected to a pixel electrode 191 of the light emitting diode LED.

In addition, a portion "A" indicated by a dotted line in FIG. 8 may correspond to the short-circuit protection area of FIG. 2 to FIG. 6.

Hereinafter, referring to FIG. 9, a structure of the display device according to an exemplary embodiment will be described.

The structure of the transistor will be described based on the driving transistor T1, the switching transistor T2, and the sixth transistor T6. The third transistor T3, the fourth transistor T4, and the seventh transistor T7 are the same as the deposition structure of the switching transistor T2, and the fifth transistor T5 is the same as the deposition structure of the sixth transistor T6, so the detailed description thereof is omitted.

A buffer layer 116 is disposed on a substrate 110. In an exemplary embodiment, the substrate 110 may be made of an insulating substrate including glass, quartz, ceramics, plastics, or the like.

A driving semiconductor layer 131a, a switching semiconductor layer 131b, and a light emission control semiconductor layer 131f are disposed on the buffer layer 116.

The driving semiconductor layer 131a includes a driving channel region, and the driving source region S1 and the driving drain region D1 spaced apart with the driving channel region interposed therebetween. The switching semiconductor layer 131b includes a switching source region S2 and a switching drain region D2 spaced apart with the switching channel region interposed therebetween. The sixth transistor T6 includes the light emission control source region S6, and a light emission control drain region D6 spaced apart with the light emission control channel region interposed therebetween.

A first gate insulating layer 122 is disposed on the driving semiconductor layer 131a, the switching semiconductor layer 131b, and the light emission control semiconductor layer 131f. Gate wires, such as the scan line 151 including the switching gate electrode 125b, the previous-stage scan line 152, the light emission control line 153 including the light emission control gate electrode 125f, and the driving gate electrode (e.g., the second storage electrode) 125a are disposed on the first gate insulating layer 122.

The second gate insulating layer 124 is disposed on the gate wires and the first gate insulating layer 122. In an exemplary embodiment, the first gate insulating layer 122 and the second gate insulating layer 124 are made of silicon nitride (SiNx) or silicon oxide (SiO2).

A driving voltage line 140 including the first electrode 179 is disposed on the second gate insulating layer 124. An interlayer insulating layer 126a is disposed on the second gate insulating layer 124 and the driving voltage line 140. In an exemplary embodiment, the interlayer insulating layer 126a may be made of a ceramic-based material such as silicon nitride (SiNx) or silicon oxide (SiO2).

On the interlayer insulating layer 126a, data wires including a data line 150 including a switching source electrode S2, a light emission control drain electrode D6, and an initialization voltage line 127 are disposed.

As described above, by disposing the driving voltage line 140 and the data line 150 with the different layers, a short between the driving voltage line 140 and the data line 150 may be prevented thereby realizing a high resolution for the display device.

The switching source electrode S2 is connected to the switching semiconductor layer 131b through the opening 62 formed in the interlayer insulating layer 126a, the first gate insulating layer 122, and the second gate insulating layer 124. The light emission control drain electrode D6 is connected to the light emission control semiconductor layer 131f through the opening 66 formed in the first gate insulating layer 122, the second gate insulating layer 124, and the interlayer insulating layer 126a. The initialization voltage line 127 is connected to the semiconductor layer 131 through an opening 64 formed in the first gate insulating layer 122, the second gate insulating layer 124, and the interlayer insulating layer 126a.

A protective layer 128 covering the data wires is disposed on the interlayer insulating layer 126a, and the pixel electrode 191 is disposed on the protective layer 128. The pixel electrode 191 is connected to the light emission control drain electrode 177f through an opening 81 formed in the protective layer 128, and the initialization voltage line 127 is connected to the pixel electrode 191 through an opening 82 formed in the protective layer 128.

A partition 350 is disposed on an edge of the pixel electrode 191 and the protective layer 128, and the partition 350 has a partition opening 351 through which the pixel electrode 191 is exposed. In an exemplary embodiment, the partition 350 may be made of a resin such as a polyacrylate and a polyimide, or of silica-based inorganic materials.

An emission layer 370 is disposed on the pixel electrode 191 exposed through the partition opening 351, and a common electrode 270 is disposed on the emission layer 370. The light emitting diode LED including the pixel electrode 191, the emission layer 370, and the common electrode 270 is disposed as described above.

A sealing member for protecting the light emitting diode LED may be disposed on the common electrode 270 and may be sealed by a sealant on the substrate 110. In an exemplary embodiment, the sealing member may be formed of various materials, such as glass, quartz, ceramic, plastics, and metal. Meanwhile, a sealing thin film layer may be formed by depositing an inorganic layer and an organic layer on the common electrode 270 while not using the sealant.

Figure 10:
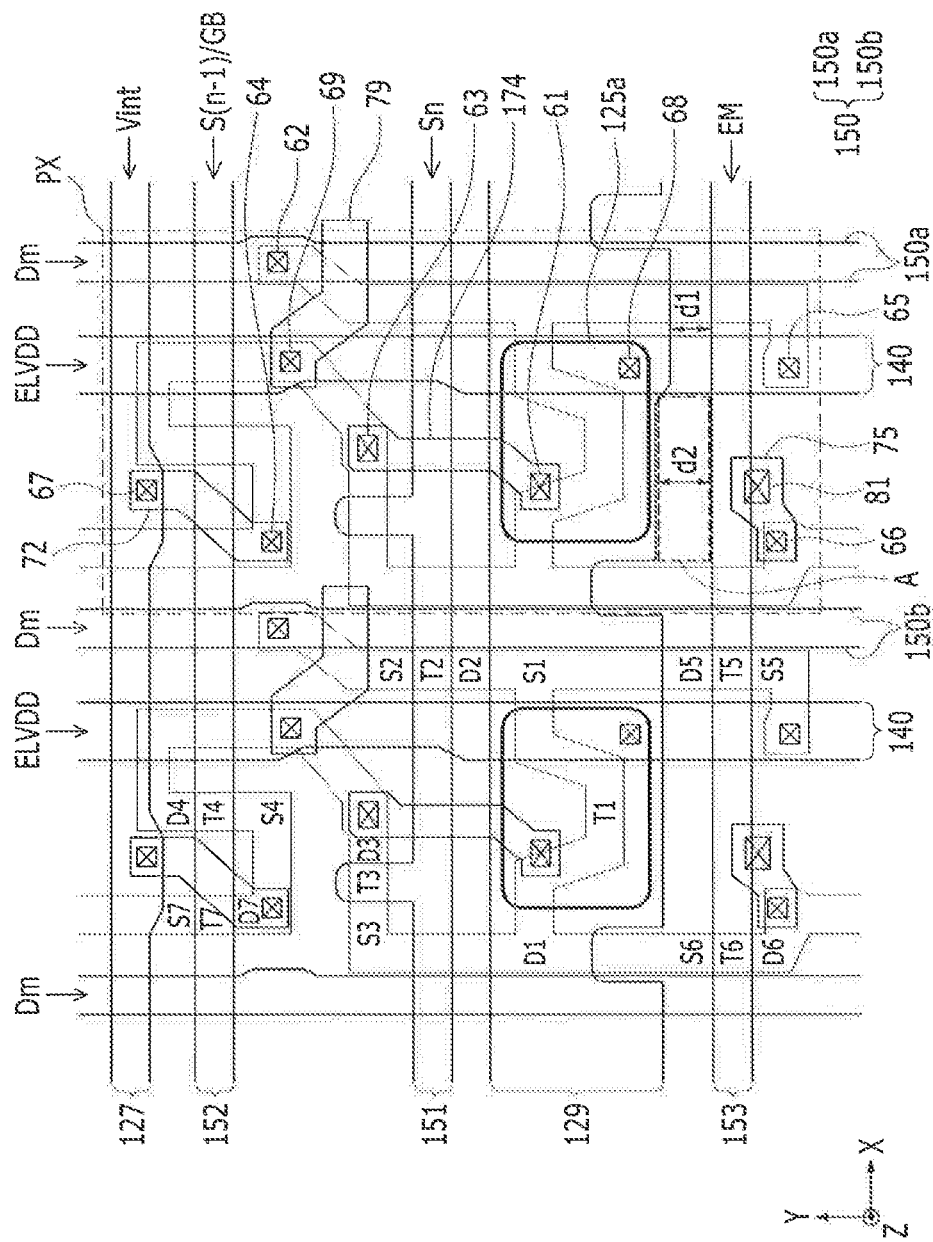
FIG. 10 is a top plan view of a display device according to an exemplary embodiment of the present invention.
Figure 11:
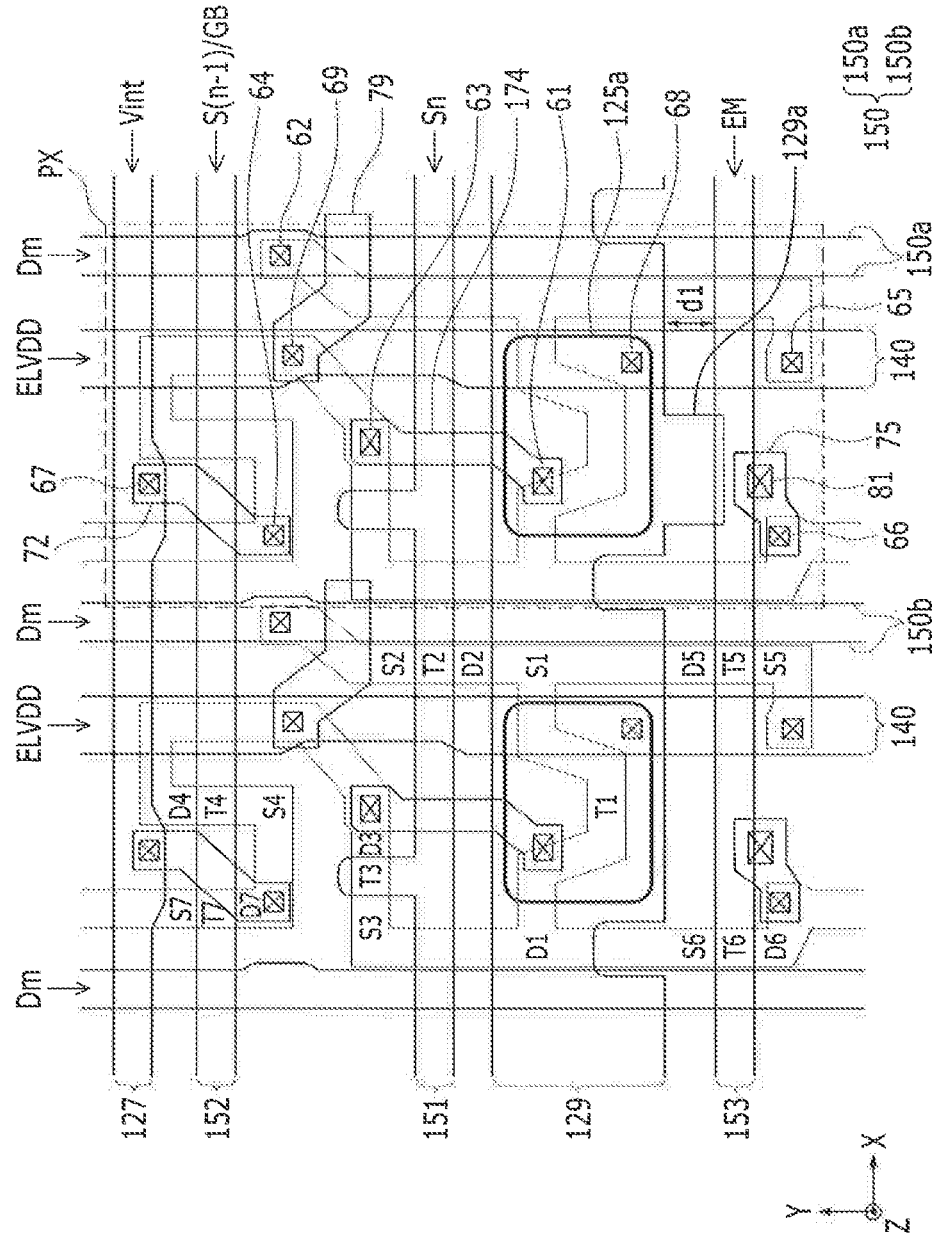
FIG. 11 is a top plan view of a display device according to an exemplary embodiment of the present invention.
Figure 12:
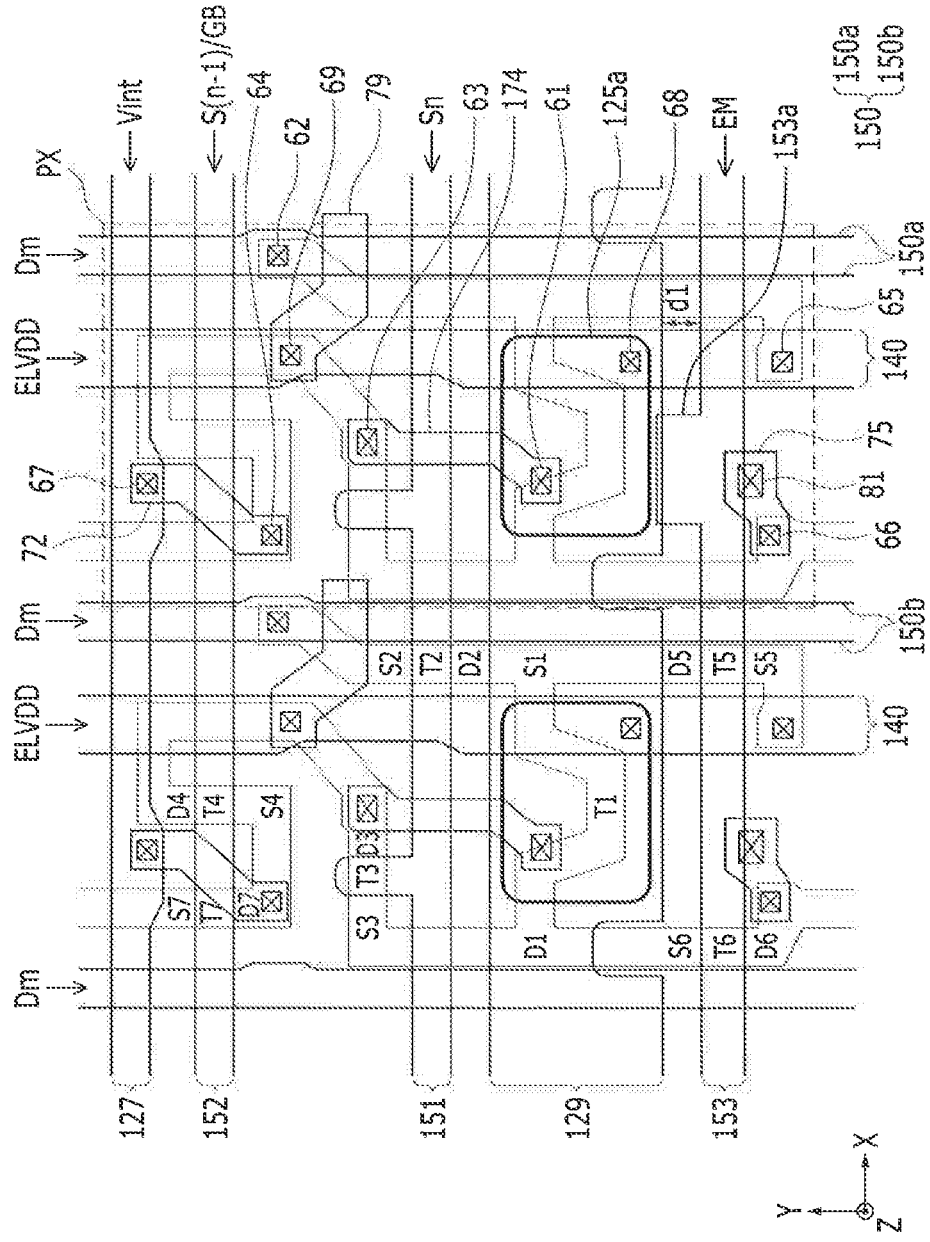
FIG. 12 is a top plan view of a display device according to an exemplary embodiment of the present invention.

FIG. 10, FIG. 11, and FIG. 12 are a top plan view of a display device according to an exemplary embodiment of the present invention.

Referring to FIG. 10, according to an exemplary embodiment, the display device includes a scan line 151, a previous-stage scan line 152, a light emission control line 153, and an initialization voltage line 127 which extend mainly along the X direction that is parallel to an upper surface of the substrate 110, and which respectively transfer a scan signal Sn, a previous-stage scan signal S(n-1), a light emission control signal EM, and an initialization voltage Vint. A bypass signal GB is transferred through the previous-stage scan line 152. However, according to another exemplary embodiment, the bypass signal GB may be the same as a signal of the present scan line 151 or a signal of another scan line. A storage electrode line 129 extends mainly along the X direction. The storage electrode line 129 may be disposed between the scan line 151 and the light emission control line 153, such as in a Y direction that is parallel to an upper surface of the substrate 110 and intersects the X direction.

The display device includes a data line 150 and a driving voltage line 140 extending in the Y direction which transfer a data voltage Dm and a driving voltage ELVDD, respectively. The data line 150 includes a first data line 150a and a second data line 150b transmitting the data voltage Dm, respectively. The first data line 150a may be connected to a switching transistor T2, which will be described later, and the data voltage applied through the first data line 150a is transferred to a driving transistor T1 through the switching transistor T2. For example, the first data line 150a and the second data line 150b may be connected to other adjacent pixels, respectively.

A first interval d1 between the storage electrode line 129 and the light emission control line 153 in between the first data line 150a and the driving voltage line 140 may be different from a second interval d2 between the storage electrode line 129 and the light emission control line 153 in between the driving voltage line 140 and the second data line 150b. For example, the first and second intervals d1, d2 may be a distance between the storage electrode line 129 and the light emission control line 153 (e.g., in the Y direction). In an exemplary embodiment, the second interval d2 may be larger than the first interval d1.

The display device includes a driving transistor T1, a second transistor T2, a third transistor T3, a fourth transistor T4, a fifth transistor T5, a sixth transistor T6, a seventh transistor T7, a storage capacitor Cst, and an light-emitting diode LED.

Each channel of the driving transistor T1, the second transistor T2, the third transistor T3, the fourth transistor T4, the fifth transistor T5, the sixth transistor T6, and the seventh transistor T7 is disposed in a semiconductor layer 131 which extends long. In addition, at least portions of the first and second electrodes of the transistors T1, T2, T3, T4, T5, T6, and T7 are disposed in the semiconductor layer 131. The semiconductor layer 131 may be bent in various shapes. In an exemplary embodiment, the semiconductor layer 131 may include an oxide semiconductor or a polycrystalline semiconductor made of polysilicon.

The semiconductor layer 131 includes a channel doped with an N-type impurity or a P-type impurity and a first doped region and a second doped region disposed at opposite sides of the channel and having a higher doping concentration than an impurity doped in the channel. The first doped region and the second doped region correspond to the first electrode and the second electrode of each of the transistors T1, T2, T3, T4, T5, T6, and T7. If one of the first doped region and the second doped region is a source region, the other doped region is a drain region. In addition, regions between the first electrodes and the second electrodes of different transistors may be doped in the semiconductor layer such that the transistors may be electrically connected to each other.

Each channel of the transistors T1, T2, T3, T4, T5, T6, and T7 overlaps the gate electrode of the corresponding transistor in the plan view, and is disposed between the first electrode and the second electrode of the corresponding transistor. The transistors T1, T2, T3, T4, T5, T6, and T7 may have the substantially same stacked structure. Hereinafter, the driving transistor T1 will be described in detail, and the remaining transistors T2, T3, T4, T5, T6, and T7 will be briefly described.

The driving transistor T1 includes a channel, a first gate electrode 125a, a first electrode S1, and a second electrode D1. The channel of the driving transistor T1 is disposed between the first electrode S1 and the second electrode D1 to overlap the first gate electrode 125a in the plan view. The channel is curved in order to form a longer channel length within a limited region compared with the case that the channel is straight. As the length of the channel becomes longer, a driving range of the gate voltage Vg applied to the first gate electrode 125a of the driving transistor T1 is widened and a driving current $I_d$ is constantly increased depending on the gate voltage Vg.

The first gate electrode 125a overlaps the channel of the driving transistor T1 in the plan view. The first electrode S1 and the second electrode D1 are disposed at opposite sides of the channel, respectively. An insulated extension of the storage electrode line 129 is disposed on the first gate electrode 125a. The extension of the storage electrode line 129 overlaps the first gate electrode 125a, with a second gate insulating layer 124 interposed therebetween in the plan view to constitute a storage capacitor Cst. The extension of the storage electrode line 129 serves as a first storage electrode E1 of the storage capacitor Cst, and the first gate electrode 125a serves as a second storage electrode E2.

In addition, the storage electrode line 129 is positioned between the scan line 151 and the emission control line 153 in the plan view. The first gate electrode 125a is connected to a driving connector 174 through the opening 61. The driving connector 174 may be connected to a second electrode D3 of the third transistor T3 through the opening 63.

A gate electrode of the second transistor T2 may be a portion of the scan line 151. The data line 150 is connected to a first electrode S2 of the second transistor T2 through an opening 62. The first electrode S2 and the second electrode D2 of the second transistor T2 may be disposed on the semiconductor layer 130.

A gate electrode of the third transistor T3 may be a portion of the scan line 151 or a portion that protrudes upward from the scan line 151 in the plan view. A first electrode S3 of the third transistor T3 is connected to a first electrode S6 of the sixth transistor T6 and the second electrode D1 of the driving transistor T1, and a second electrode D3 of the third transistor T3 is connected to the driving gate electrode 125a through the driving connector 174. A capacitor control pattern 79 may be positioned on the second electrode D3 of the third transistor T3. A parasitic capacitor exists in the pixel PX, and the image quality characteristics may change when the voltage applied to the parasitic capacitor changes. The capacitor control pattern 79 is connected to the driving voltage line 140 through the opening 69. For this reason, the drive voltage ELVDD which is a constant DC voltage is applied to the parasitic capacitor, and it can prevent that an image quality characteristic changes. The capacitor control pattern 79 may be positioned in an area different from that shown, and a voltage other than the driving voltage ELVDD may be applied to the capacitor control pattern 79.

The fourth transistor T4 is disposed at the portion where the previous-stage scan line 152 and the semiconductor layer 131 meet. A gate electrode of the second transistor T2 may be a portion of the previous-stage scan line 152. A first electrode S4 of the fourth transistor T4 is connected to a second electrode D7 of a seventh transistor T7 through the semiconductor layer 131. A second electrode D4 of the fourth transistor T4 is connected to the second electrode D3 of the third transistor T3 through the semiconductor layer 131.

A gate electrode of the fifth transistor T5 may be a portion of the light emission control line 153. The driving voltage line 140 is connected to a first electrode S5 of the fifth transistor T5 through an opening 65, and a second electrode D5 is connected to the first electrode S1 of the driving transistor T1 through the semiconductor layer 131.

A gate electrode of the sixth transistor T6 may be a portion of the light emission control line 153. An emitting connector 75 is connected to a second electrode D6 of the sixth transistor T6 through an opening 66, and a first electrode S6 is connected to the second electrode D1 of the driving transistor T1 through the semiconductor layer 131.

A gate electrode of the seventh transistor T7 may be a portion of the previous-stage scan line 152. A first electrode S7 of the fifth transistor T7 is connected to the first electrode S4 of the fourth transistor T4. The initialization voltage line 127 is connected to a second connector 72 through an opening 67. The initialization connector 72 may be connected to the semiconductor layer 131 through the opening 64, and the second electrode D7 may be connected to the second electrode D6 of the sixth transistor T6. A first electrode S7 the seventh transistor T7 and a second electrode D7 the seventh transistor T7 may be disposed on the semiconductor layer 131.

The storage capacitor Cst includes a first storage electrode E1 and a second storage electrode E2 which overlap each other, with the second gate insulating layer 124 interposed therebetween. The second storage electrode E2 may correspond to the first gate electrode 125a of the driving transistor T1, and the first storage electrode E1 may correspond to the extension of the storage electrode line 129. Herein, the second gate insulating layer 124 serves as a dielectric material, and a capacitance of the storage capacitor Cst is determined by the electric charges accumulated in the storage capacitor Cst and a voltage between the first and second storage electrodes E1 and E2. It is possible to secure a space in which the storage capacitor Cst can be disposed in the space narrowed by the channel of the driving transistor T1 occupying a large area within the pixel by using the first gate electrode 125a as the second storage electrode E2.

The driving voltage line 140 is connected to the first storage electrode E1 through an opening 68. Accordingly, the storage capacitor Cst stores a charge corresponding to a difference between the driving voltage ELVDD transferred to the first storage electrode E1 through the driving voltage line 140 and the gate voltage Vg of the first gate electrode 155.

A pixel electrode called an anode electrode is connected to the light emitting connector 75 through an opening 81. A portion "A" indicated by a dotted line in FIG. 10 may correspond to the short circuit protection region of FIG. 2.

For example, the first gate wiring 132 in FIG. 2 may correspond to the storage electrode line 129 of FIG. 10. The second gate wiring 134 in FIG. 2 may correspond to the light emission control line 153 of FIG. 10.

As shown in the exemplary embodiment of FIG. 10, the portion A is a portion surrounded by an extension of the storage electrode line 129, the light emission control line 153, the driving voltage line 140, and the second data line 150b. In the portion A, the first interval between one side of the storage electrode line 129 and the light emission control line 153 may be larger than the second interval formed between the driving voltage line 140 and the first data line 150a.

Therefore, the interval between the storage electrode line 129 and the light emission control line 153 is widened to prevent a short circuit between the storage electrode line 129 and the light emission control line 153. In addition, the portion "A" indicated by a dotted line in FIG. 10 may correspond to the short circuit protection area of FIGS. 3 to 6.

Referring to FIG. 11, the storage electrode line 129 extending in the first direction X may include an extending portion 129a in the second direction Y from the extension of the storage electrode line 129. The extending portion 129a extended from the storage electrode line 129 may partially overlap (e.g., in the Z direction) the light emission control line 153. Since the first gate insulating layer 122 is positioned between the storage electrode line 129 and the light emission control line 153, the extending portion 129a of the storage electrode line 129 and the light emission control line 153 may not be short-circuited. The extending portion 129a may be the stepped part 170 of FIG. 5 and FIG. 6. The extending portion 129a may be positioned between the second data line 150b and the driving voltage line 140. The extending portion 129a of the storage electrode line 129 is positioned only in one pixel PX among the plurality of pixels, and in another pixel PX, the interval between the storage electrode line 129 and the light emission control line 153 is widened as shown in FIG. 10.

Referring to FIG. 12, the light emission control line 153 extending in the first direction X may include an extending portion 153a extending partially in the second direction Y. The extending portion 153a extended from the light emission control line 153 may partially overlap (e.g., in the Z direction) the extension of the storage electrode line 129. The extending portion 153a may be the stepped part 170 of FIG. 5 and FIG. 6. The extending portion 153a may be positioned between the second data line 150b and the driving voltage line 140. The extending portion 153a of the emission control line 153 is positioned only in one pixel PX among the plurality of pixels, and in another pixel PX, the interval between the storage electrode line 129 and the light emission control line 153 is widened as shown in FIG. 10.

Referring to FIG. 11 and FIG. 12, the display device according to the exemplary embodiment prevents the storage electrode line 129 and the light emission control line 153 from being short-circuited between the second data line 150b and the driving voltage line 140.

Exemplary embodiments of the present invention are not limited to the above-mentioned exemplary embodiments.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a substrate;
a scan line and a light emission control line disposed on the substrate and extending in a first direction that is parallel to an upper surface of the substrate;
a storage electrode line disposed between the scan line and the light emission control line and extending in the first direction;
a first data line and a second data line configured to receive a data voltage, respectively, the first data line and the second data line are arranged in the first direction and extending in a second direction that is parallel to the upper surface of the substrate and crosses the first direction;
a driving voltage line extending in the second direction and disposed between the first data line and the second data line;
a switching transistor connected to the scan line and the first data line; and
a driving transistor connected to the switching transistor,
wherein a gate electrode of the driving transistor overlaps a portion of the storage electrode line,
wherein the storage electrode line and the light emission control line in between the first data line and the driving voltage line are spaced apart by a first interval,
wherein the storage electrode line and the light emission control line in between the driving voltage line and the second data line are spaced apart by a second interval that is different from the first interval.

2. The display device of claim 1, wherein the second interval is greater than the first interval.

3. The display device of claim 1, further comprising:
a first insulating layer disposed between the substrate, the scan line, and the light emission control line; and
a second insulating layer disposed between the first insulating layer and the storage electrode line,
wherein an extension of the storage electrode line and the gate electrode of the driving transistor comprise a storage capacitor with the second insulating layer therebetween.

4. A display device comprising:
a substrate;
a scan line and a light emission control line disposed on the substrate and extending in a first direction that is parallel to an upper surface of the substrate;
a storage electrode line disposed between the scan line and the light emission control line and extending in the first direction;
a first data line and a second data line configured to receive a data voltage, respectively, the first data line and the second data line are arranged in the first direction and extend in a second direction that is parallel to the upper surface of the substrate and crosses the first direction;
a driving voltage line extending in the second direction and disposed between the first data line and the second data line;
a switching transistor connected to the scan line and the first data line; and
a driving transistor connected to the switching transistor,
wherein a gate electrode of the driving transistor overlaps a portion of the storage electrode line,
wherein the storage electrode line or the light emission control line includes an extending portion in the second direction, and
the extending portion is disposed between the second data line and the driving voltage line.

5. The display device of claim 4, wherein the extending portion extends from the storage electrode line to the light emission control line and overlaps a portion of the light emission control line.

6. The display device of claim 4, wherein the extending portion extends from the light emission control line to the storage electrode line and overlaps a portion of the storage electrode line.

7. A display device comprising:
a substrate;
a scan line and a light emission control line disposed on the substrate and extending in a first direction;
a storage electrode line disposed between the scan line and the light emission control line;
a first data line and a second data line extending in a second direction crossing the first direction;
a driving voltage line extending in the second direction and disposed between the first data line and the second data line;
a switching transistor connected to the scan line and the first data line; and
a driving transistor connected to the switching transistor,
wherein a gate electrode of the driving transistor overlaps a portion of the storage electrode line,
wherein an area bounded by the storage electrode line and the light emission control line intersecting the first data line and the driving voltage line is defined as a first area,
wherein an area bounded by the storage electrode line and the light emission control line intersecting the driving voltage line and the second data line is defined as a second area,
wherein the storage electrode line and the light emission control line are spaced apart by a first interval in the first area and spaced apart by a second interval in the second area, wherein the first interval is different from the second interval.

8. The display device of claim 7, wherein the second interval is greater than the first interval.

* * * * *